(12) United States Patent
Amaki et al.

(10) Patent No.: US 11,055,215 B2
(45) Date of Patent: Jul. 6, 2021

(54) MEMORY SYSTEM AND CONTROL METHOD FOR GARBAGE COLLECTION IN A MEMORY SYSTEM

(71) Applicant: TOSHIBA MEMORY CORPORATION, Tokyo (JP)

(72) Inventors: Takehiko Amaki, Yokohama Kanagawa (JP); Toshikatsu Hida, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/991,071

(22) Filed: May 29, 2018

(65) Prior Publication Data

US 2019/0079861 A1 Mar. 14, 2019

(30) Foreign Application Priority Data

Sep. 13, 2017 (JP) .............................. JP2017-175895

(51) Int. Cl.

| | |
|---|---|
| *G06F 12/02* | (2006.01) |
| *G06F 11/10* | (2006.01) |
| *G11C 16/34* | (2006.01) |
| *G11C 29/52* | (2006.01) |
| *G11C 7/10* | (2006.01) |
| *G11C 29/44* | (2006.01) |
| *G11C 29/42* | (2006.01) |
| *G11C 29/04* | (2006.01) |

(52) U.S. Cl.
CPC ...... *G06F 12/0253* (2013.01); *G06F 11/1068* (2013.01); *G06F 12/0246* (2013.01); *G11C 7/1006* (2013.01); *G11C 16/349* (2013.01); *G11C 29/42* (2013.01); *G11C 29/44* (2013.01); *G11C 29/52* (2013.01); *G06F 2212/1028* (2013.01); *G06F 2212/7205* (2013.01); *G06F 2212/7211* (2013.01); *G11C 2029/0411* (2013.01); *G11C 2029/4402* (2013.01)

(58) Field of Classification Search
CPC ............. G06F 11/1068; G06F 12/0246; G06F 12/0253; G06F 12/00–16; G11C 29/44; G11C 16/349; G11C 29/42; G11C 29/52; G11C 7/1006
USPC .................................................. 711/103, 154
See application file for complete search history.

(56) References Cited

U.S. PATENT DOCUMENTS

| | | |
|---|---|---|
| 8,495,336 B2 | 7/2013 | Fukutomi et al. |
| 8,977,805 B2 | 3/2015 | Maislos et al. |
| 9,323,661 B2 | 4/2016 | Harasawa et al. |

(Continued)

FOREIGN PATENT DOCUMENTS

| | | |
|---|---|---|
| JP | 5066209 B2 | 11/2012 |
| JP | 5813589 B2 | 11/2015 |
| JP | 5976939 B2 | 8/2016 |

*Primary Examiner* — Tuan V Thai
*Assistant Examiner* — Edward Waddy, Jr.
(74) *Attorney, Agent, or Firm* — Kim & Stewart LLP

(57) ABSTRACT

A memory system includes a nonvolatile memory that has a plurality of physical blocks, and a memory controller circuit configured to execute encoding of data to be written in the nonvolatile memory and decoding of data read from the nonvolatile memory, execute garbage collection for the nonvolatile memory, and determine whether or not decoding and encoding is to be executed, for data which is read from a valid cluster of a physical block targeted for garbage collection.

15 Claims, 14 Drawing Sheets

(56) References Cited

U.S. PATENT DOCUMENTS

| | | | |
|---|---|---|---|
| 9,547,588 B1* | 1/2017 | Biederman | G06F 12/0246 |
| 2004/0093472 A1* | 5/2004 | Dahlen | G06F 11/2061 |
| | | | 711/158 |
| 2009/0193313 A1* | 7/2009 | Kong | H03M 13/2906 |
| | | | 714/755 |
| 2014/0164879 A1* | 6/2014 | Tam | G06F 11/1012 |
| | | | 714/773 |
| 2015/0220277 A1* | 8/2015 | Lee | G06F 3/0625 |
| | | | 711/103 |
| 2018/0047456 A1* | 2/2018 | Zhang | G11C 16/26 |
| 2018/0373450 A1* | 12/2018 | Ji | G06F 3/0653 |

* cited by examiner

| BLOCK ID | STRESS HISTORY (NUMBER OF PROGRAM/ ERASE TIMES) | RETENTION TIME | NUMBER OF READS | ERROR RATE (NUMBER OF ERROR BITs PER 1K BYTE) |
|---|---|---|---|---|
| 0 | 400 | 20 HOURS | 0 | 10 |
| 1 | 200 | 10 HOURS | 0 | 20 |
| 2 | 500 | 90 HOURS | 1k | 80 |
| 3 | 300 | 10 HOURS | 50k | 60 |
| ⋮ | ⋮ | ⋮ | ⋮ | ⋮ |

MEMORY SYSTEM AND CONTROL METHOD FOR GARBAGE COLLECTION IN A MEMORY SYSTEM

CROSS-REFERENCE TO RELATED APPLICATION

This application is based upon and claims the benefit of priority from Japanese Patent Application No. 2017-175895, filed Sep. 13, 2017, the entire contents of which are incorporated herein by reference.

FIELD

Embodiments described herein relate generally to a memory system, and a control method thereof.

BACKGROUND

In a memory system using NAND flash memory (hereinafter, referred to as NAND memory) as a storage medium, for example, in order to allocate an empty block (hereinafter, referred to as a free block) to satisfy a write request from a host, valid data stored in a block of which a valid data ratio is low is collected in one or a small number of blocks. That is, a garbage collection (also referred to as compaction) is performed.

DETAILED DESCRIPTION

Embodiments provide a memory system capable of reducing power consumption during garbage collection, a control method thereof, and a program.

In general, according to one embodiment, a memory system includes a nonvolatile memory that has a plurality of physical blocks and a memory controller circuit configured to execute encoding of data to be written in the nonvolatile memory and decoding of data read from the nonvolatile memory, execute garbage collection for the nonvolatile memory, and determine whether or not decoding and encoding is to be executed for data, which is read from a valid cluster of a physical block targeted for garbage collection.

Hereinafter, a memory system, a control method thereof, and a program thereof according to embodiments will be described in detail with reference to the accompanying drawings. The scope of the present disclosure is not limited to the following embodiments.

Generally, during garbage collection, an operation of collecting valid data from a plurality of blocks of which a valid data ratio (which may be a valid cluster ratio) is low and writing the valid data to one or more free blocks is executed. Here, the valid data ratio is a ratio of a total size of pieces of valid data recorded in each block to a size of the block and the valid cluster ratio is a ratio of clusters having stored valid data among clusters in each block. When the collected valid data is written into a free block, decoding and re-encoding for the collected valid data is usually performed. Here, it should be noted that power consumption required for decoding and re-encoding is relatively large.

For garbage collection executed in units of logical blocks, it may be necessary to move valid data within a certain memory chip to another memory chip. The logical block is a chunk of one or a plurality of physical blocks selected from each of different nonvolatile memory chips and is managed as, for example, a unit of erasure for a nonvolatile memory chip. In such a case, it is necessary to transfer valid data targeted for garbage collection to another memory chip via a channel or the like. However, in a memory system with a large capacity in which a large number of memory chips are connected to each other via the channel, power consumption when valid data is transferred to another memory chip during garbage collection has increased to an extent that cannot be ignored.

In the following embodiments, several examples of a memory system capable of reducing power consumption during garbage collection, a control method thereof, and a program will be described.

First Embodiment

Figure 1:
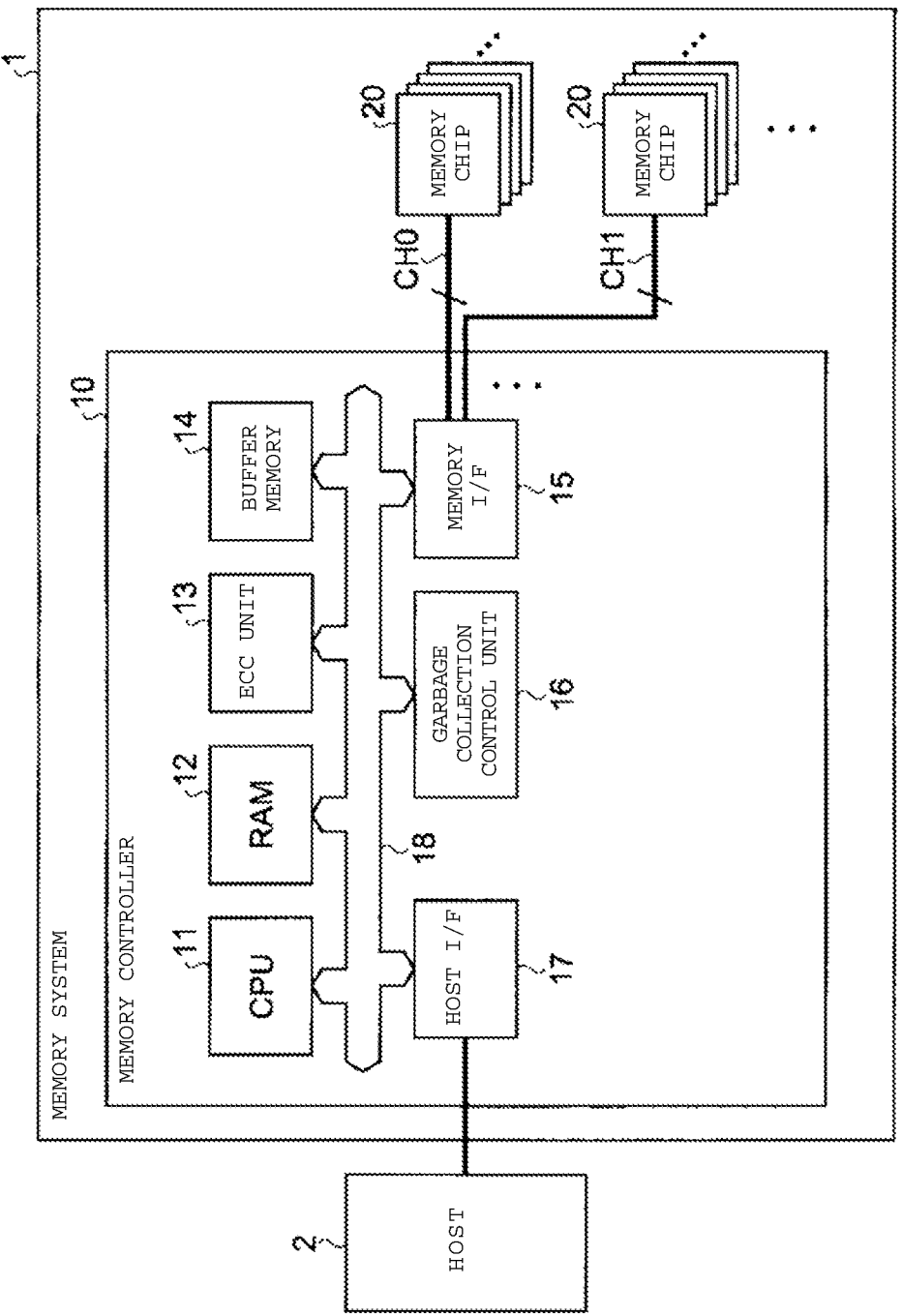
FIG. 1 is a schematic block diagram of a memory system according to a first embodiment.

FIG. 1 is a schematic block diagram of a memory system according to a first embodiment. As illustrated in FIG. 1, a memory system 1 includes a memory controller 10 and a plurality of nonvolatile memory chips 20. The memory controller 10 and the nonvolatile memory chips 20 constitute one memory system. An example of such a memory system 1 includes a memory card such as an SD® card, a solid state drive (SSD). Hereinafter, individual nonvolatile memory chips 20 are simply referred to as the memory chip 20.

Each memory chip 20 is a semiconductor chip in which a nonvolatile memory such as a NAND flash memory is formed. However, it is not limited to the nonvolatile memory, and various memory chips capable of being targeted for garbage collection can be employed.

The memory controller 10 is configured with a semiconductor chip such as a system-on-a-chip (SoC) in which respective units are mounted on one chip, and accesses the memory chip 20 according to a request received from a host 2 connected via a host bus. The host 2 has a configuration of a computer. The computer may be, for example, a personal computer, a server device, a portable information apparatus, a digital still camera. As the standard for the host bus, any standard can be adopted.

The memory controller 10 includes a central processing unit (CPU) 11, a random access memory (RAM) 12, an error correction code (ECC) unit 13, a buffer memory 14, a memory interface (I/F) 15, a garbage collection control unit 16, and a host interface (I/F) 17, which are connected to each other via an internal bus 18.

The host I/F 17 is connected to the host 2 via the host bus, and transfers a request and data received from the host 2 to the CPU 11 and the buffer memory 14, respectively. Under an instruction from the CPU 11, the host I/F 17 transfers data in the buffer memory 14 to the host 2.

The CPU 11 controls the overall operation of the memory controller 10. For example, when a write request is received from the host 2, the CPU 11 issues a write command to the memory I/F 15 according to the request. Similarly, for reading, the CPU 11 issues a read command to the memory I/F 15 according to a request from the host 2. At the time of erasing data, the CPU 11 issues an erase command to the memory I/F 15. In addition, the CPU 11 executes various processing for managing the memory chip 20, such as wear leveling.

The memory I/F 15 is connected to a plurality of memory chips 20 via one or more channels CH0, CH1, . . . , and controls communication with the memory chip 20. One or more memory chips 20 can be connected to each of the channels CH0, CH1, . . . , extending from the memory I/F 15.

The memory I/F 15 outputs a signal ALE, a signal CLE, a signal WEn, and a signal REn to the memory chip 20 based on an instruction received from the CPU 11. At the time of writing, the memory I/F 15 transfers a write command and an address issued by the CPU 11 and write data in the buffer memory 14 to the memory chip 20 as an input/output signal I/O. On the other hand, at the time of reading, the memory I/F 15 transfers a read command and an address issued by the CPU 11 to the memory chip 20 as the input/output signal I/O. The memory I/F 15 receives data read from the memory chip 20 as the input/output signal I/O and transfers the read data to the buffer memory 14. At the time of accessing the memory chip 20, the memory I/F 15 receives a ready/busy signal RBn from the memory chip 20 and determines, based on the ready/busy signal RBn, whether the memory chip 20 is accessible or not.

Here, the signal CEn is a signal for enabling the memory chip 20. The signal CLE is a signal for notifying the memory chip 20 that the input signal I/O is a command. The signal ALE is a signal for notifying the memory chip 20 that the input signal I/O is an address. The signal WEn is a signal for allowing the memory chip 20 to fetch the input signal I/O. The signal REn is a signal for reading the output signal I/O from the memory chip 20. The ready/busy signal RBn is a signal indicating whether the memory chip 20 is in a ready state (a state in which a command from the memory controller 10 can be received) or a busy state (a state in which a command from the memory controller 10 cannot be received). The input/output signal I/O is, for example, an 8-bit signal. The input/output signal I/O carries information transmitted and received between the memory chip 20 and the memory controller 10, and includes a command, an address, write data, read data, and the like.

The buffer memory 14 functions as a memory area for temporarily holding write data or read data. The buffer memory 14 may be configured with a dynamic RAM (DRAM), a static RAM (SRAM), or the like.

The RAM 12 is, for example, a semiconductor memory such as an SRAM or a DRAM. The RAM 12 is used as a work area of the CPU 11 and the garbage collection control unit 16 which will be described later. Firmware for managing the memory chip 20, various management tables, and the like can be loaded onto the RAM 12.

The ECC unit 13 is an encoding and decoding processing unit and performs encoding and decoding of data for error detection and error correction in read data. Specifically, the ECC unit 13 encodes data to be written into the memory chip 20. The ECC unit 13 decodes data read from the memory chip 20. The ECC unit 13 executes error detection and error correction on the read data by decoding. In a case where error correction fails, the ECC unit 13 notifies the CPU 11 of failure of the error correction.

In the first embodiment, various algorithms can be adopted for algorithms of encoding and decoding by the ECC unit 13. For example, at the time of writing data, the ECC unit 13 generates a parity based on write data and adds the generated parity to data to generate a code word to be written in the memory chip 20. On the other hand, at the time of reading data, the ECC unit 13 generates a syndrome based on the parity and determines the presence and absence of an error in the read data based on the generated syndrome. Further, when an error is detected in the read data, the ECC unit 13 specifies a location of the error and corrects the error. The number of correctable errors by the ECC unit 13 is determined, for example, by the number of parity bits or the like. In a case where the number of errors exceeding the number of correctable errors is detected in the read data, the ECC unit 13 fails in the error correction and notifies the CPU 11 of the failure of the error correction.

Various codes such as a low-density parity-check (LDPC) code can be applied to the code used by the ECC unit 13. In a case where a Reed-Solomon (RS) code or the like is adopted as an inter-chip code, re-encoding may be necessary during garbage collection.

Figures 2, 3:
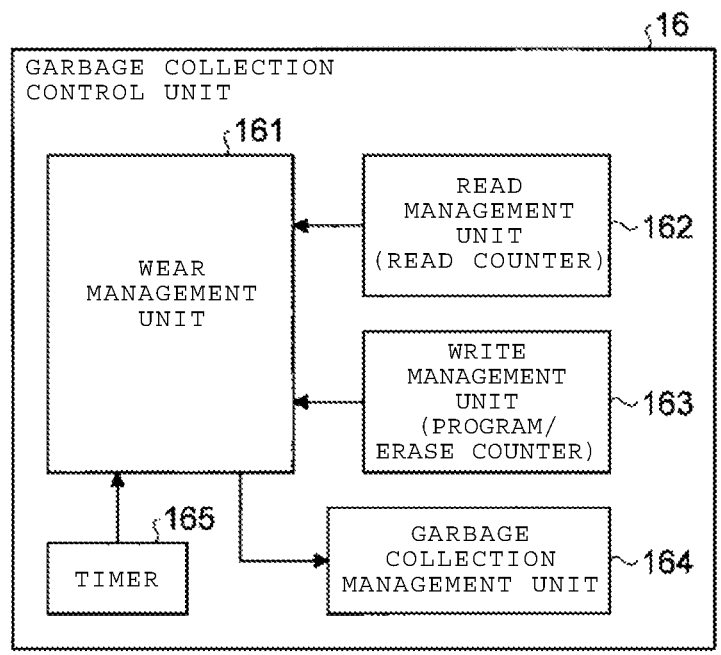
FIG. 2 is a schematic block diagram of a garbage collection control unit according to the first embodiment.
FIG. 3 illustrates an example of a table managed by a wear management unit according to the first embodiment.

The garbage collection control unit 16 instructs execution of garbage collection for the memory chip 20 periodically, or according to a request from the host 2 or the like. FIG. 2 illustrates an example of the garbage collection control unit 16 according to the first embodiment. In the first embodiment, the garbage collection control unit 16 is configured separately from the CPU 11. Alternatively, the CPU 11 may be configured to implement the garbage collection control unit 16 as one of its functions.

As illustrated in FIG. 2, the garbage collection control unit 16 includes a wear management unit 161, a read management unit 162, a write management unit 163, a garbage collection management unit 164, and a timer 165.

The read management unit 162 includes, for example, a read counter that counts the number of reads to each physical block within each memory chip 20 (hereinafter, referred to as a physical block or simply as a block), and transmits information, such as the number of reads or the number of error bits notified from the ECC unit 13 at the time of reading (including a patrol read which will be described later) for each block, to the wear management unit 161. For example, in a case where a page (or cluster) read operation is executed for the memory chip 20, the read management unit 162 increments the read counter of a corresponding block by one and issues update notification of the number of reads to the wear management unit 161. The number of reads for the block may be obtained in units of blocks, in units of a plurality of blocks, or in units of word lines.

The patrol read is a read operation to detect or repair a defect or the like of each memory cell in the memory chip 20 and is, for example, a read operation periodically executed for all memory cells of each memory chip 20.

The read management unit 162, in a case where a collection source block is selected in a garbage collection operation which will be described later, may further acquire information, such as the number of reads of the block or the number of error bits detected by the ECC unit 13 in at least one page of the read block, and transmit the acquired information such as the number of reads and number of error bits to the wear management unit 161.

The error rate in the embodiment of the present disclosure is a general term indicating a rate of errors in data, specifically, the error rate includes information such as a bit error rate (BER) and the number of error bits per 1K (kilo) byte. The bit error rate (BER) is an error occurrence probability per one bit. Such an error rate can be obtained directly from information such as the number of reads for each block, and the number of error bits detected by the ECC unit 13 in data read from each block (hereinafter, referred to as a failure bit count (FBC) information). Here, the FBC information is information related to the number of error bits obtained by the ECC unit 13 at normal read or patrol read and is, for example, information obtained from a size of read data and the number of error bits included in the read data. The error rate can also be obtained as an estimated value from the number of times of program/erase for each block, a retention time after completion of the immediately preceding write to each block, the number of reads for each block, and the like. In addition, a stress history (or stress history information), which will be described later, may mean the number of times of program/erase for each block. In the following description, information related to degradation of reliability of each block, such as the error rate or the stress history is collectively referred to as wear information.

The write management unit 163 includes, for example, a program/erase counter for counting the number of times programming or erasing (hereinafter also referred to as "program/erase") is carried out for each block within each memory chip 20, and transmits the number of times of program/erase of each block and a write completion time to each block, to the wear management unit 161. For example, in a case where an erase command to a block (which may be an erase command to a logical block unit) is issued to the memory chip 20, the write management unit 163 increments the number of times of program/erase of the block by one and issues a stress history update notification to the wear management unit 161. In a case where the write operation to the block within the memory chip 20 is executed, the write management unit 163 notifies the wear management unit 161 of the completion of the write operation. In response to the notification, the wear management unit 161 obtains the completion time of the write operation from the timer 165.

The wear management unit 161 calculates (in particular, estimates) an error rate in the read data from the number of reads received from the read management unit 162 and the write completion time received from the write management unit 163 and holds the calculated (estimated) error rate. In a case where an error rate acquired during an actual read operation is available separately from the error rate calculated (estimated) from the number of reads and the write completion time, the wear management unit 161 may hold the worst error rate among such error rates as an error rate. The wear management unit 161 may also hold the number of times of program/erase of each block received from the write management unit 163 as the stress history of each block.

The wear management unit 161 manages the stress history which is the number of times of program/erase for each block, the retention time of the block obtained from the write completion time for the block, the number of reads for each block, and the error rate for each block by using, for example, a table. FIG. 3 is a diagram illustrating an example of a table managed by the wear management unit 161 according to the first embodiment. As illustrated in FIG. 3, the wear management unit 161 holds the stress history (the number of times of program/erase), the retention time, the number of reads, and the error rate in association with a block ID that uniquely identifies a block. The retention time is a period during which writing to the corresponding block is not performed after the last write time. In the example illustrated in FIG. 3, the number of error bits per 1K byte is adopted as the error rate for each block.

Description will be made by referring back to FIG. 2. When garbage collection for the memory chip 20 is executed, the garbage collection management unit 164 acquires various information, such as an error rate and a stress history managed for a target block, from the wear management unit 161 and executes different garbage collection according to the acquired information. For example, in a case where the error rate, stress history, or the like of a block targeted for garbage collection (hereinafter, referred to as a collection source block) is relatively low, the garbage collection management unit 164 omits decoding and re-encoding (hereinafter, referred to as ECC processing) for the target data and executes garbage collection, and otherwise, in a case where the error rate, stress history, or the like of a block targeted for garbage collection is relatively high, the garbage collection management unit 164 executes garbage collection without omitting the ECC processing. For example, in a case where wear information (error rate, stress history, or the like) of the collection source block is less than a predetermined threshold value, the garbage collection management unit 164 determines that the collection source block is not close to being worn, omits ECC processing for the target data, and executes garbage collection and otherwise, in a case where the wear information (error rate, stress history, or the like) of the collection source block is equal to or greater than the predetermined threshold value, the garbage collection management unit 164 determines that the collection source block is close to being worn and executes garbage collection without omitting ECC processing for the target data. As a threshold value to be set for wear information, a different threshold value may be provided for each parameter such as an error rate and a stress history included in the wear information.

As such, the determination to execute ECC processing or not during garbage collection is performed based on wear information such as the stress history or the error rate of the collection source block, to ensure reliability in a case of targeting a block with relatively low reliability and to give priority to low power consumption in a case of targeting a block with relatively high reliability. As a result, it is possible to reduce power consumption during garbage collection as a whole.

Figure 4:
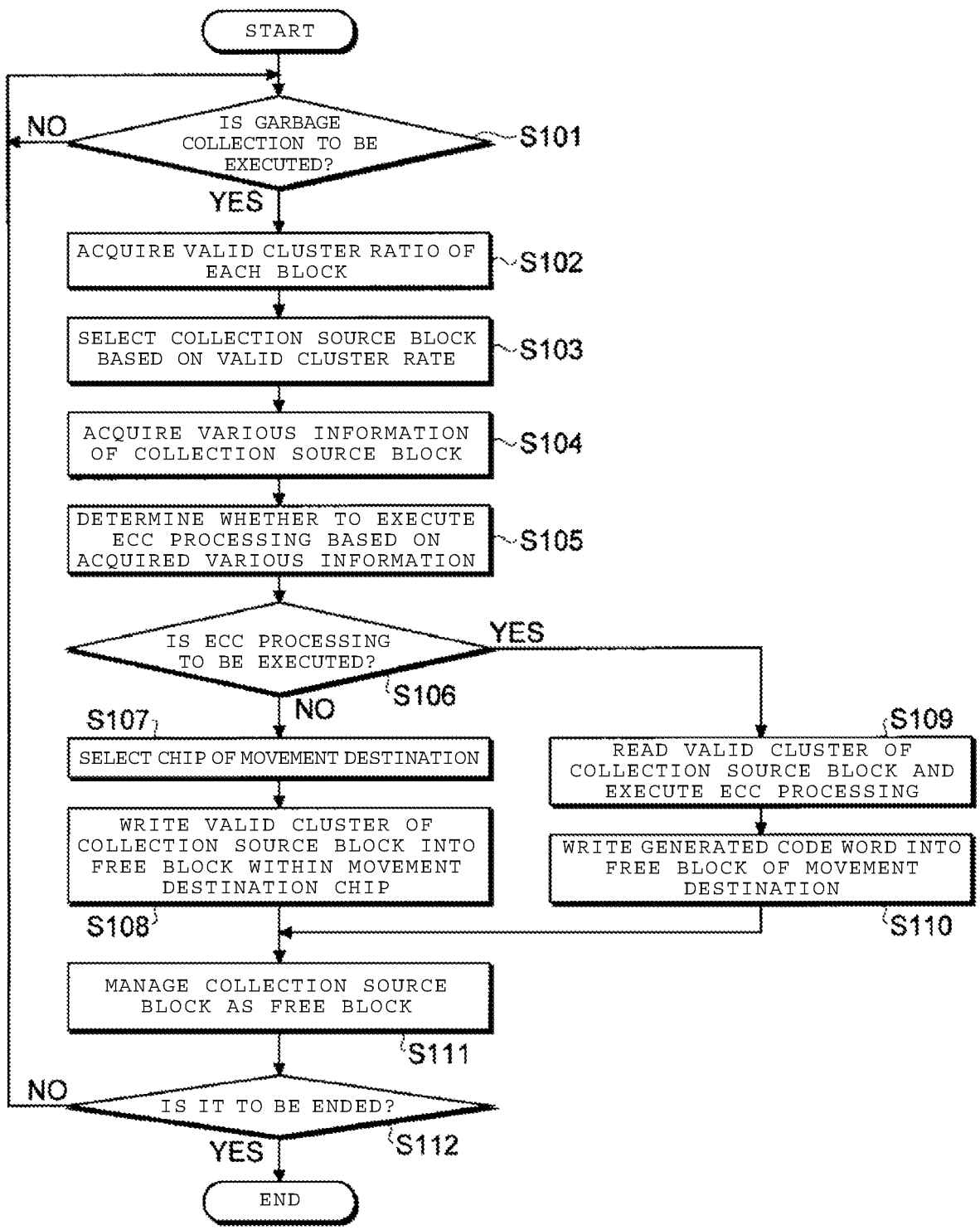
FIG. 4 is a flowchart illustrating an example of a garbage collection operation according to the first embodiment.

Next, the following will describe an example of a garbage collection operation according to the first embodiment in detail with reference to the drawings. FIG. 4 is a flowchart illustrating an example of an outline of the garbage collection operation according to the first embodiment. In the following description, a case where garbage collection is executed in units of logical blocks is given as an example.

As illustrated in FIG. 4, in the first embodiment, first, the garbage collection management unit 164 determines whether garbage collection is to be executed or not (step S101). As described above, the determination as to whether garbage collection is to be executed or not may be made periodically or, in accordance with a request from the host 2 or the like.

In a case where it is determined that the garbage collection is to be executed (YES in step S101), the garbage collection management unit 164 acquires a valid cluster ratio (or may be a valid data ratio) of each block (step S102), and selects a collection source block targeted for the garbage collection based on the acquired valid cluster ratio (step S103). As a rule for selecting collection source block, various rules such as a method of selecting the collection source block in order from a block having a low valid cluster ratio or a method of selecting the collection source block in order from a block having a low valid cluster ratio and having a relatively low update frequency can be adopted. A predetermined number of blocks may be selected as collection source blocks, all blocks of which the valid cluster ratio is equal to or less than a predetermined threshold may be selected, or a number of blocks of which a data size of the valid clusters amounts to a size of one or a predetermined number of free blocks may be selected.

Next, the garbage collection management unit 164 acquires various information (see FIG. 3) managed by the wear management unit 161 for the collection source block selected in step S103 (step S104) and determines whether or not to execute ECC processing based on the acquired information (step S105). In the first embodiment, the garbage collection management unit 164 acquires wear information as the various information. An operation to determine whether or not to execute ECC processing will be described later with reference to FIG. 5.

As the determination result in step S105, in a case where it is determined that ECC processing is not to be executed (NO in step S106), the garbage collection management unit 164 proceeds to step S107. On the other hand, in a case where it is determined that ECC processing is to be executed (YES in step S106), the garbage collection management unit 164 proceeds to step S109.

In step S107, the garbage collection management unit 164 selects a memory chip 20 which becomes a movement destination of a valid cluster in the collection source block (hereinafter, referred to as a movement destination chip). In the exemplary embodiment of the present disclosure, a movement of a valid cluster also includes a movement of an ECC code for data in the valid cluster. The selection operation of the movement destination chip will be described later with reference to FIG. 6. Subsequently, the garbage collection management unit 164 reads a valid cluster from the collection source block, stores the read valid cluster in a free block within the movement destination chip (step S108), and proceeds to step S111.

On the other hand, in step S109, the garbage collection management unit 164 reads the valid cluster from the collection source block and inputs data within the read valid cluster to the ECC unit 13 of the memory controller 10 to execute ECC processing for the read data. Subsequently, the garbage collection management unit 164 writes the code word generated by the ECC processing by the ECC unit 13 into a free block within a memory chip 20 which is set as a movement destination (step S110), and the garbage collection management unit 164 proceeds to step S111.

In step S111, the garbage collection management unit 164 manages the block selected as the collection source block in step S103 as a free block. Thereafter, the garbage collection management unit 164 determines whether the garbage collection operation is to be ended or not (step S112) and in a case where it is determined that the garbage collection operation is to be ended (YES in step S112), the garbage collection operation is ended. On the other hand, in a case where it is determined that the garbage collection operation is not to be ended (NO in step S112), the garbage collection management unit 164 returns to step S101 and executes subsequent operations.

Figure 5:
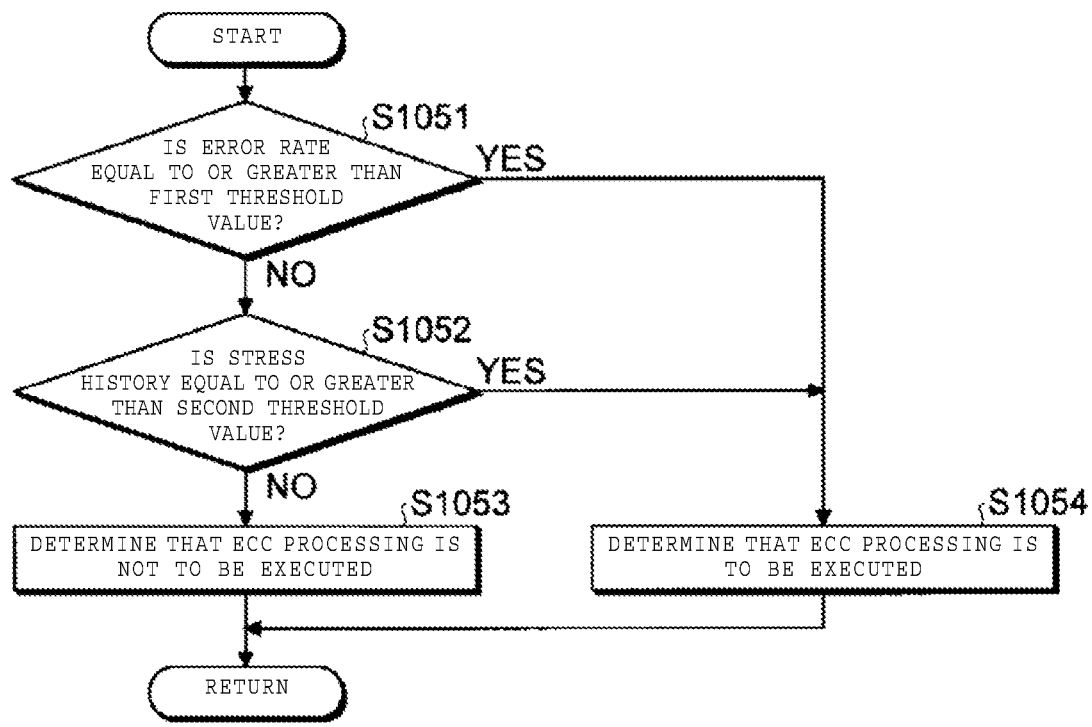
FIG. 5 is a flowchart illustrating an example of an operation to determine whether or not to execute ECC processing according to the first embodiment.

Next, the operation to determine whether or not to execute the ECC processing illustrated in step S105 in FIG. 4 will be described in detail with reference to FIG. 5. As illustrated in FIG. 5, in step S1051, the garbage collection management unit 164 determines whether or not the error rate included in the information acquired in step S104 of FIG. 4 (i.e., wear information in the first embodiment) is equal to or greater than a first threshold value, which is set in advance. In a case where it is determined that the error rate is equal to or greater than the first threshold value (YES in step S1051), the garbage collection management unit 164 determines that the ECC processing is to be executed (step S1054) and the garbage collection management unit 164 returns to the operation illustrated in FIG. 4. The error rate to be compared with the first threshold value may include the bit error rate (BER), the data retention time, read disturbance, and the like and a different first threshold value may be set for each of the BER, the data retention time, the read disturbance, and the like.

On the other hand, in a case where it is determined that the error rate is less than the first threshold value (NO in step S1051), in step S1052, the garbage collection management unit 164 determines whether the stress history included in the information acquired in step S104 of FIG. 4 (in the first embodiment, wear information) is equal to or greater than a second threshold value, which is set in advance. In a case where it is determined that the stress history is equal to or greater than the second threshold value (YES in step S1052), the garbage collection management unit 164 determines that the ECC processing is to be executed (step S1054) and the garbage collection management unit 164 returns to the operation illustrated in FIG. 4.

Furthermore, in a case where it is determined that the stress history is less than the second threshold value (NO in step S1052), the garbage collection management unit 164 determines that the ECC processing is not to be executed (step S1053) and returns to the operation illustrated in FIG. 4.

As in the operations illustrated in FIG. 5, the determination to execute the ECC processing or not is determined based on the wear information such as the stress history and the error rate of the block selected as the collection source block to ensure reliability in a case where a block with relatively low reliability is targeted for garbage collection, and to give priority to low power consumption in a case where a block with relatively high reliability is targeted for garbage collection. As a result, it is possible to reduce power consumption during garbage collection as a whole.

Figure 6:
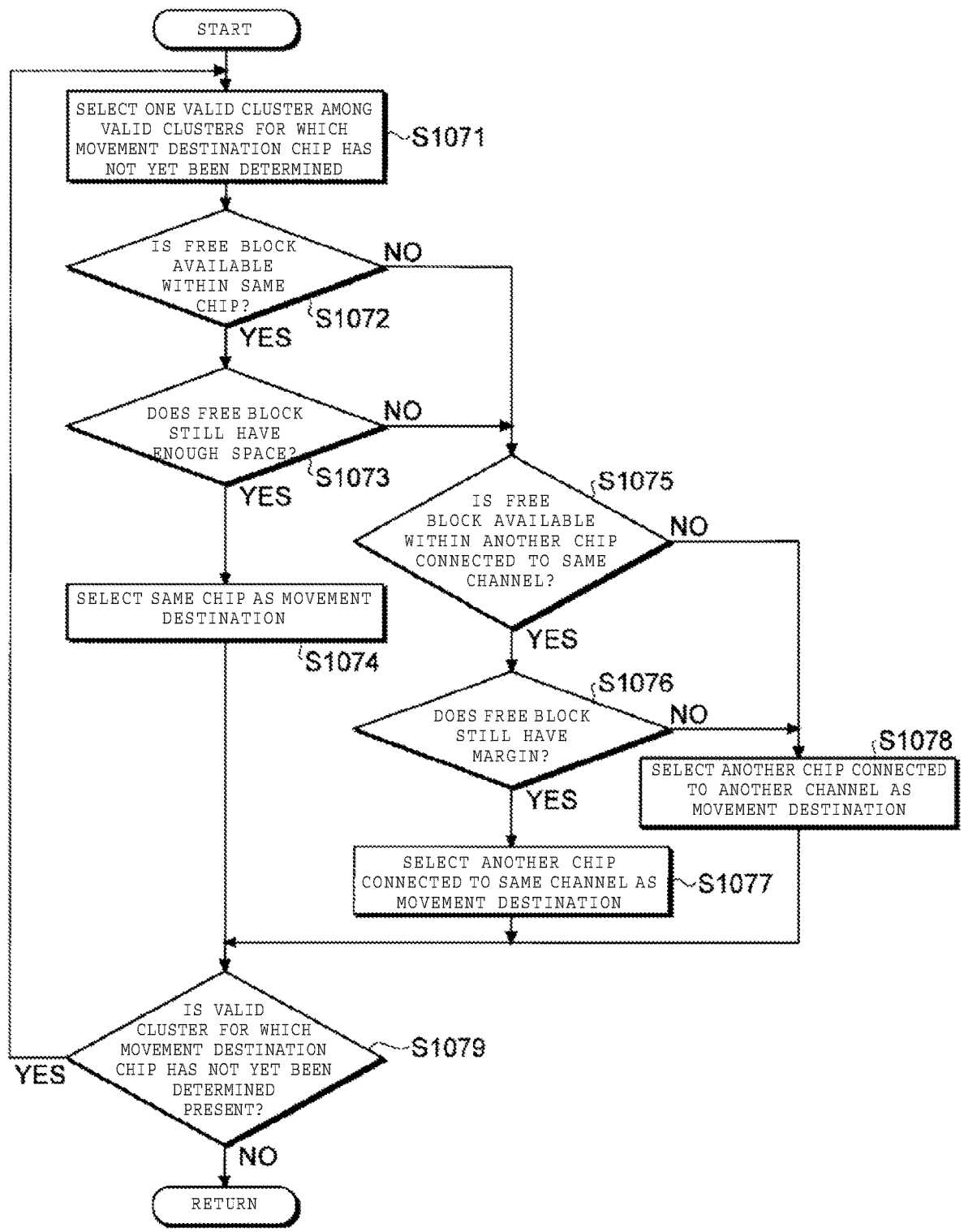
FIG. 6 is a flowchart illustrating an example of a selection operation of a movement destination chip according to the first embodiment.

Next, the selection operation of the movement destination chip illustrated in step S107 in FIG. 4 will be described in detail with reference to FIG. 6. As illustrated in FIG. 6, the garbage collection management unit 164 selects one valid cluster, for which a movement destination chip has not yet been determined, from among the valid clusters within the collection source block selected in step S103 of FIG. 4 (Step S1071).

Next, the garbage collection management unit 164 determines whether a free block is available within the same memory chip 20 as the memory chip 20 in which the selected valid cluster is stored or not (step S1072). In a case where it is determined that the free block is available (YES in step S1072), the garbage collection management unit 164 determines, from the total data size of valid clusters which have been allocated to the free block and the size of the free block, whether the free block still has an enough space to store the valid cluster selected in step S1071 or not (Step S1073). In a case where it is determined that the free block still has the enough space (YES in step S1073), the garbage collection management unit 164 selects the same memory chip 20 as the memory chip 20, in which the selected valid cluster is stored, as the movement destination chip (Step S1074) and proceeds to step S1079.

On the other hand, in a case where it is determined that the free block is not available within the same memory chip 20 as the memory chip 20 in which the valid cluster selected in step S1071 is stored (NO in step S1072), or in a case where it is determined that the free block of the memory chip 20 does not have the enough space to store the valid cluster selected in step S1071 (NO in step S1073), the garbage collection management unit 164 determines whether or not a free block is available within another memory chip 20 connected to the same channel as the channel to which the memory chip 20, in which the valid cluster selected in step S1071 is stored, is connected (step S1075).

In a case where it is determined that the free block is available within another memory chip 20 connected to the same channel (YES in step S1075), the garbage collection management unit 164 determines, from the total data size of valid clusters which have been allocated to the free block and the size of the free block, whether the free block still has an enough space to store the valid cluster selected in step S1071 or not (Step S1076). In a case where it is determined that the free block still has the enough space (YES in step S1076), the garbage collection management unit 164 selects said another memory chip 20 as the movement destination chip, which is connected to the same channel as the channel, to which the memory chip 20 in which the selected valid cluster is stored, is connected, (Step S1077) and proceeds to step S1079.

On the other hand, in a case where it is determined that the free block is not available within another memory chip 20 connected to the same channel as the channel to which the memory chip 20, in which the valid cluster selected in S1071 is stored, is connected (NO in step S1075), or in a case where it is determined that the free block of the memory chip 20 does not have the enough space to store the valid cluster selected in step S1071 (NO in step S1076), the garbage collection management unit 164 selects, as the movement destination chip, another memory chip 20 connected to a channel different from the channel to which the memory chip 20, in which the valid cluster selected in S1071 is stored, is connected (step S1078), and proceeds to step S1079.

In step S1079, the garbage collection management unit 164 determines whether the valid cluster, for which the movement destination chip has not yet been determined, among the valid clusters within the collection source block selected in step S103 of FIG. 4, exists or not. In a case where it is determined that such a valid cluster does not exist (NO in step S1079), the garbage collection management unit 164 returns to the operation illustrated in FIG. 4. On the other hand, in a case where it is determined that the valid cluster, for which the movement destination chip has not yet been determined, exists (YES in step S1079), the garbage collection management unit 164 returns to Step S1071 and executes subsequent operations.

By allowing the operations to be performed as illustrated in FIG. 6, it is possible to allow a priority of movement of the valid cluster within the same chip, which requires the lowest power consumption, to be the highest and allow a priority of movement of the valid cluster connected to a different channel, which requires the largest power consumption, to be the lowest. In other words, based on a physical address of the valid cluster targeted for the garbage collection, it is possible to preferentially select a memory chip 20, which has a small driving power for data line, as the movement destination chip. As a result, it is possible to reduce power consumption during the garbage collection.

Figure 7:
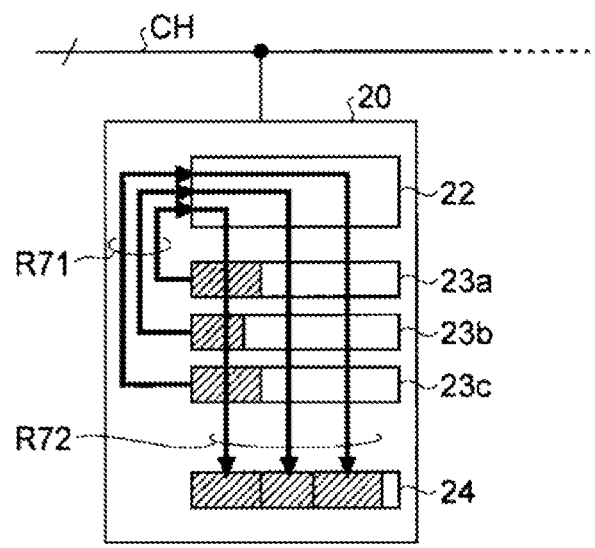
FIG. 7 is a diagram for explaining a case where a valid cluster moves within the same memory chip during garbage collection according to the first embodiment.
Figure 8:
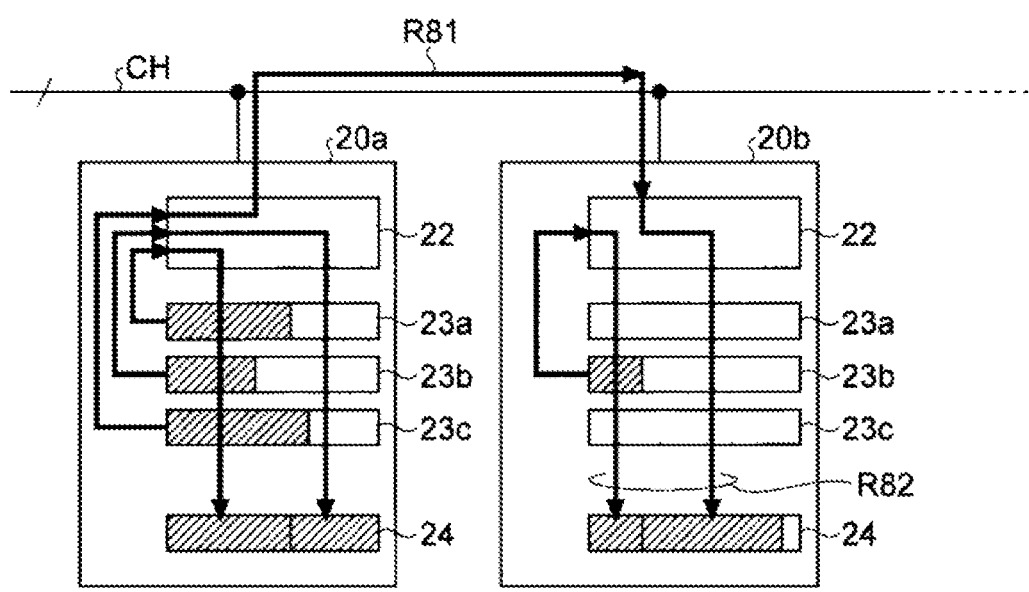
FIG. 8 is a diagram for explaining a case where the valid cluster moves between memory chips connected to the same channel during garbage collection according to the first embodiment.
Figure 9:
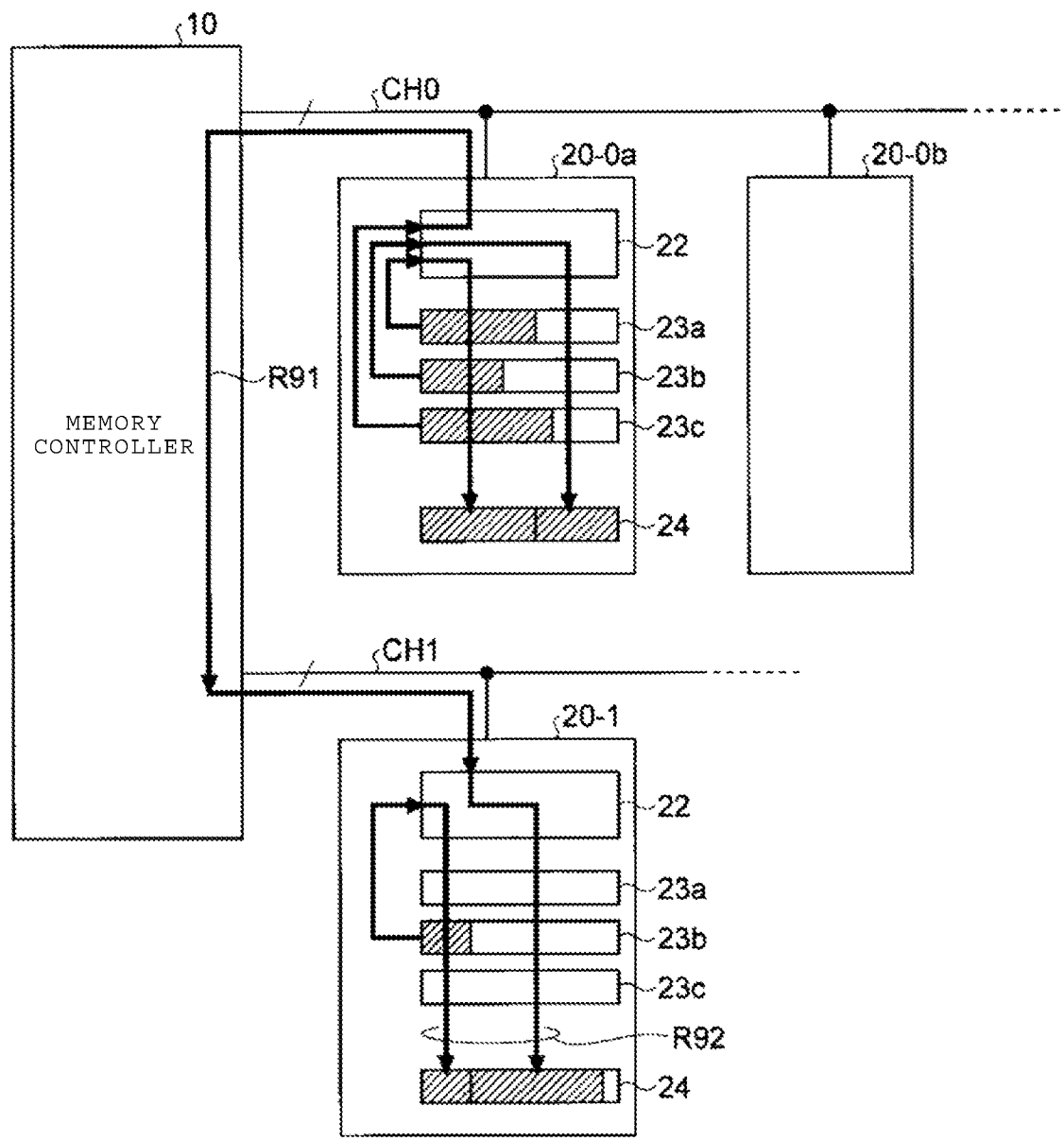
FIG. 9 is a diagram for explaining a case where the valid cluster moves between memory chips connected to different channels during garbage collection according to the first embodiment.

Next, the movement of valid clusters in a case where garbage collection is executed will be described using a specific example. FIGS. 7 to 9 are diagrams for explaining the movement of valid clusters in a case where garbage collection is executed. FIG. 7 illustrates an example of a case where the same memory chip 20 as the memory chip 20 in which the valid clusters are stored is selected as a movement destination chip of the valid clusters which corresponds to step S1074 in FIG. 6. FIG. 8 illustrates an example of a case where another memory chip 20*b* connected to the same channel CH as a channel to which the memory chip 20*a*, in which the valid clusters are stored, is connected as a movement destination chip of some of the valid clusters which corresponds to step S1077 in FIG. 6. FIG. 9 illustrates an example of a case where another memory chip 20-1 connected to a channel CH1 different from a channel CH0 to which a memory chip 20-0*a*, in which the valid clusters are stored, is connected as a movement destination chip of the valid clusters which corresponds to step S1078 in FIG. 6. In FIG. 7 to FIG. 9, hatched areas illustrate the valid clusters.

As illustrated in FIG. 7, in a case where the same memory chip 20 as the memory chip 20, in which the valid cluster is stored, is selected as the movement destination chip of the valid clusters, the valid clusters in each of collection source blocks 23*a* to 23*c* are input (R71) into a latch circuit 22 within the same memory chip 20, arranged, and then stored (R72) in a free block 24 within the same memory chip 20.

Further, as illustrated in FIG. 8, in a case where it is unable to select the same memory chip 20*a* as the memory chip 20*a*, in which the valid clusters are stored, as the movement destination chip for all the valid clusters and another memory chip 20*b* connected to the same channel CH as the channel to which the memory chip 20*a* is connected is selected as the movement destination chip for some of the valid clusters, the valid clusters for which the memory chip 20*b* is selected as the movement destination chip are input (R81) into the latch circuit 22 within the memory chip 20*b* via the channel CH, arranged together with other valid clusters as needed, and then stored (R82) in the free block 24 within the memory chip 20b.

Furthermore, as illustrated in FIG. 9, in a case where it is unable to select other memory chips 20-0b connected to the same channel CH0 as the channel to which the memory chip 20-0a, in which the valid clusters are stored, is connected as the movement destination chip for all the valid clusters and another memory chip 20-1 connected to the channel CH1 different from the channel CH0 to which the memory chip 20-0a is connected is selected as the movement destination chip for some of the valid clusters, the valid clusters for which the memory chip 20-1 is selected as the movement destination chip are input (R91) into the latch circuit 22 within the memory chip 20-1 via the channel CH0, the memory controller 10, and the channel CH1, arranged together with other valid clusters as needed, and then stored (R92) in the free block 24 within the memory chip 20-1. In this case, although valid clusters are passed through the memory controller 10, it is possible to skip ECC processing by, for example, turning the ECC unit 13 off using a power control unit (not illustrated). As a result, even in a case where the valid clusters are moved through the memory controller 10 between memory chips 20 connected to different channels, it is possible to avoid an increase in power consumption due to occurrence of ECC processing.

As described above, in a case where garbage collection is executed, there is a possibility that deviation in an valid cluster ratio exists between memory chips 20 and thus, a capacity of the free block in the same memory chip 20 is insufficient and accordingly, there may be a case where the garbage collection cannot be completed within the memory chip 20 by itself and some or all of the valid clusters need to be moved to another memory chip 20. In a case where garbage collection is executed in units of physical blocks, garbage collection can be completed within the same memory chip 20 even when deviation of the valid cluster is present for each physical block and thus, it is possible to restrict the movement destination of the valid cluster to the same memory chip 20. In this case, it is possible to move the valid cluster to the free block in the same memory chip 20 by the operation illustrated in FIG. 7.

Figure 10:
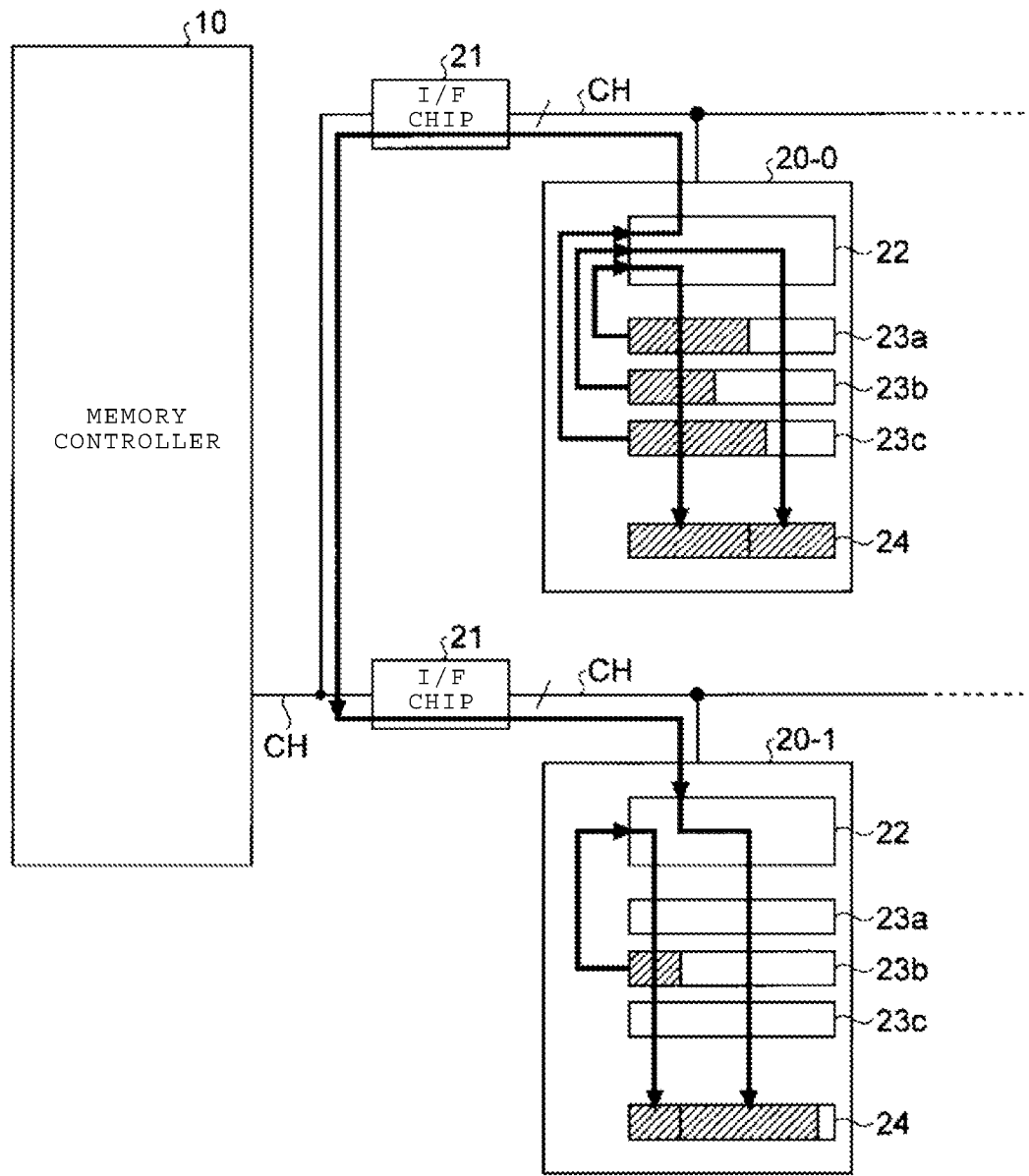
FIG. 10 is a diagram for explaining a case where the valid cluster moves across an interface chip during garbage collection according to the first embodiment.

Further, in a configuration in which an interface (I/F) chip for controlling access to each memory chip 20 exists between the memory controller 10 and the plurality of memory chips 20, a difference in power consumption during garbage collection occurs depending on whether the valid cluster is moved across the I/F chip or not. For example, in the example illustrated in FIG. 10, a plurality of I/F chips 21 are provided for the channel CH extending from the memory controller 10. In such a configuration, even in a case where the valid cluster is moved from the memory chip 20-0 to another memory chip 20-1 connected to the same channel CH, which corresponds to step S1077 in FIG. 6 and FIG. 8, there are a case where the valid cluster is moved across the I/F chip 21 and a case where the valid cluster is not moved across the I/F chip 21, but power consumption is smaller in the case of not passing through the I/F chip 21. For that reason, in such a case, a configuration in which the memory chip 20 which does not need to pass through the I/F chip 21 is preferentially selected as the movement destination chip may be adopted.

Figure 11:
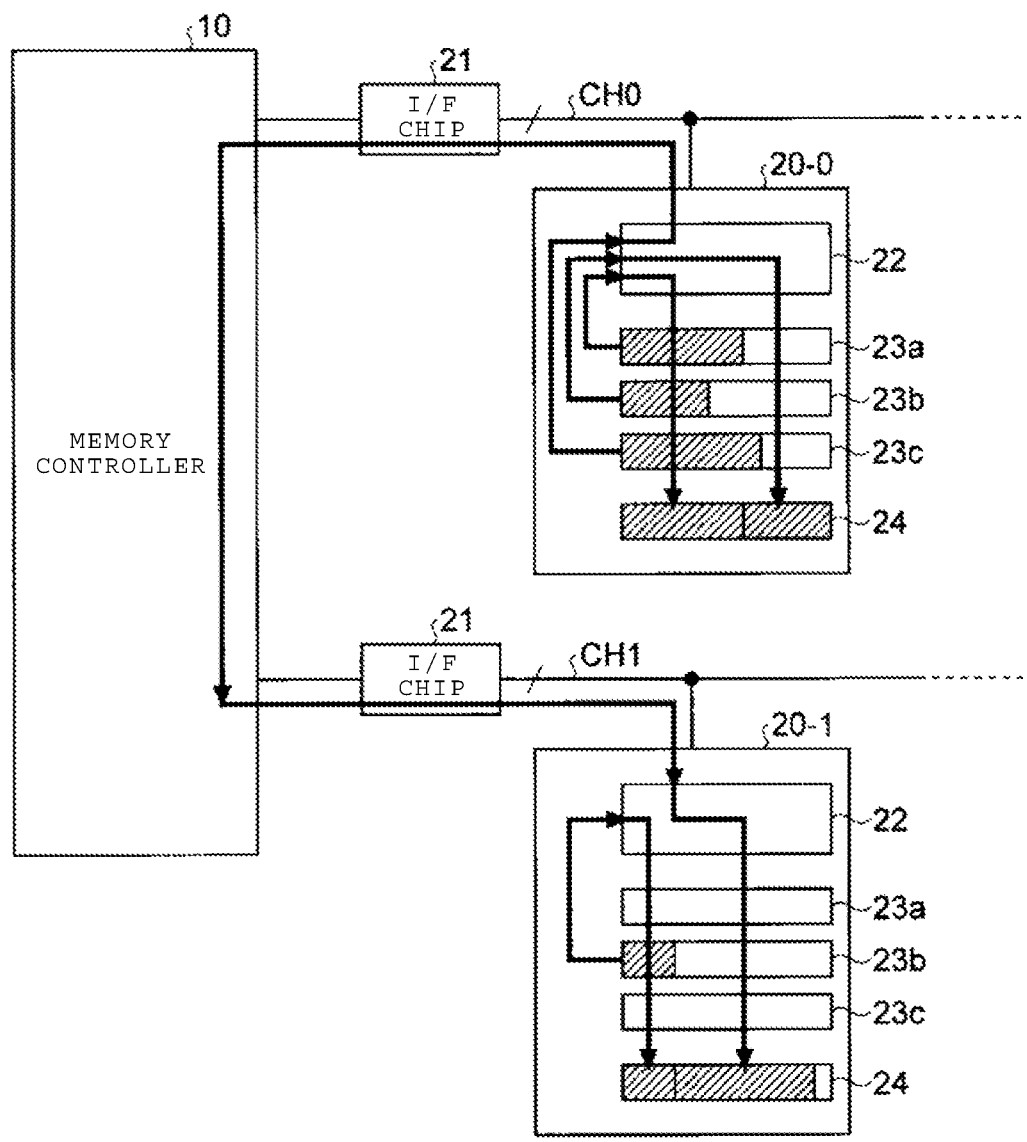
FIG. 11 is a diagram for explaining another case where the valid cluster moves across the interface chip during garbage collection according to the first embodiment.

As illustrated in FIG. 11, there is also a case where the I/F chip 21 is individually provided for each of the channels CH0, CH1, . . . . In such a case, although it is possible to move the valid cluster to the memory chip 20-1 connected to the channel CH1 different from the channel CH0 to which the memory chip 20-0 is connected by the same method as illustrated in FIG. 9, even in that case, it is possible to skip ECC processing by turning the ECC unit 13 of the memory controller 10 off. As a result, it is possible to avoid an increase in power consumption due to occurrence of ECC processing.

As described above, according to the first embodiment, it is possible to determine whether or not to execute ECC processing during garbage collection based on wear information such as the stress history and the error rate of the collection source block. As a result, it is possible to reduce power consumption during garbage collection as a whole.

Further, in garbage collection, it is possible to preferentially select the memory chip 20 having a small driving power for a channel or the like necessary for moving the valid cluster to the movement destination chip and thus, it is possible to further reduce power consumption during garbage collection.

Second Embodiment

Next, a memory system, a control method thereof, and a program according to a second embodiment will be described in detail with reference to the drawings.

Figure 12:
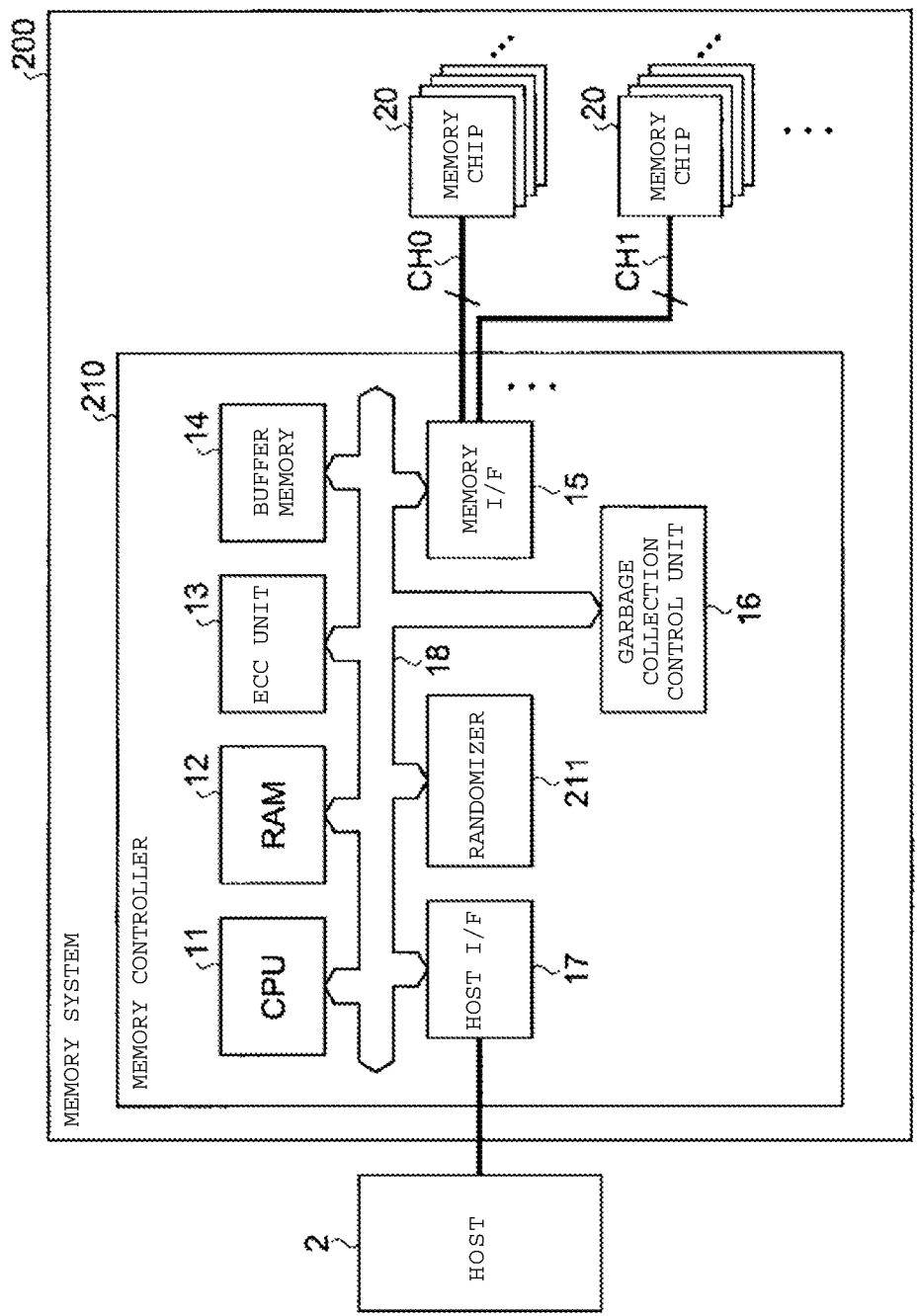
FIG. 12 is a schematic block diagram of a memory system according to a second embodiment.

FIG. 12 is a schematic block diagram of a memory system according to a second embodiment. As illustrated in FIG. 12, in a memory system 200, a memory controller 210 further includes a randomizer 211 in the same configuration as that of the memory system 1 according to the first embodiment (see FIG. 1 and the like).

The randomizer 211 is, for example, a pseudo random number generator configured with a linear feedback shift register (LFSR) or the like, and generates a pseudo random number in accordance with an input seed. For example, write data such as a code word generated by the ECC unit 13 is randomized by being subjected to an exclusive logical sum (XOR) operation with the pseudo random number generated by the randomizer 211, and then stored in the memory chip 20. Randomization of read data, which is read from the memory chip 20, is de-randomized by using the same pseudo random number generated with the same seed as the seed used at the time of writing and then, the read data is input to the ECC unit 13 to be decoded.

The seed to be used for randomization of write data is determined according to a storing location (e.g., physical location such as word line number and page number) of the data in the memory chip 20. For that reason, in the configuration in which data is randomized and then written into the memory chip 20, de-randomization should be conducted on the valid cluster of a movement target at the time of garbage collection first and thereafter, re-randomize data by using pseudo random numbers generated with the seed in accordance with anew storing location.

To perform de-randomization conducted on the valid clusters of the movement target, the valid clusters should be input to the memory controller 210 first regardless of whether or not the valid cluster is moved between the memory chips 20. At that time, the ECC unit 13 in an active state within the memory controller 210 executes ECC processing, resulting in consuming power. In the second embodiment, for example, in the operation described in step S1053 of FIG. 5 in the first embodiment, in a case where ECC processing is determined not to be executed, the ECC unit 13 in the memory controller 210 is temporarily turned off by using, a power control unit (not illustrated). With this, ECC processing is skipped and thus, it is possible to avoid an increase in power consumption due to the ECC processing.

As described above, even in a case where it is necessary to execute de-randomization and/or re-randomizing by using the randomizer 211 in the memory controller 210 during garbage collection, the ECC unit 13 in the memory controller 210 is temporarily turned off to skip ECC processing and thus, it is possible to avoid an increase in power consumption due to the ECC processing.

Each memory chip 20 may be provided with an on-chip randomizer. In such a case, not via the memory controller 210, it is possible to de-randomize the valid cluster of the movement target and re-randomize the valid cluster.

Figure 13:
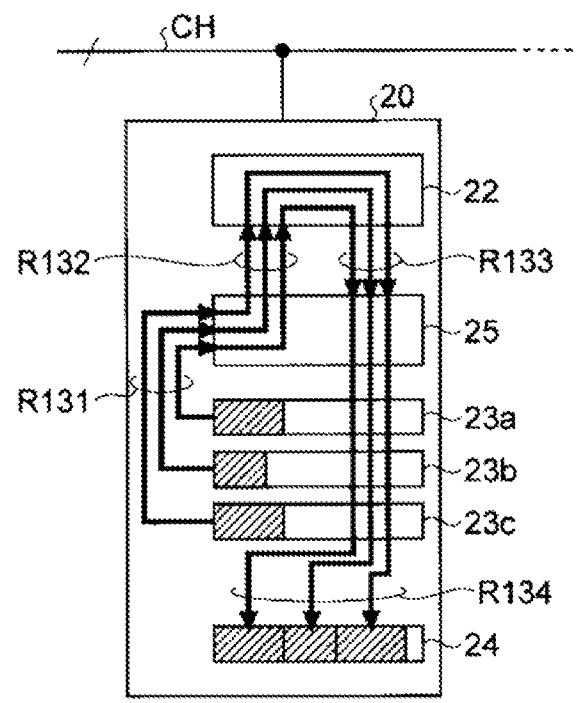
FIG. 13 is a diagram for explaining a case where a valid cluster moves within a memory chip on which a randomizer is installed in a system-on-chip during garbage collection according to the second embodiment.

For example, in a case where a valid cluster is moved to a free block in the same memory chip 20, as illustrated in FIG. 13, data in the valid cluster read from the collection source blocks 23a to 23c is input to the randomizer 25 within the same memory chip 20 (R131) to be de-randomized, is input to the latch circuit 22 (R132) to be arranged, is input to the randomizer 25 again (R133) to be randomized and then, is stored in the free block 24 in the chip 20 (R134). Also, for example, even in a case where the valid cluster is moved to the free block within another memory chip 20 connected to the same channel or a different channel, similarly, data within the valid cluster read from the collection source block 23 is input to the randomizer 25 within the memory chip 20 to be de-randomized, is input to the latch circuit 22 within the movement destination chip to be arranged with other valid clusters as needed, is input to the randomizer 25 within the movement destination chip and re-randomized and then, is stored in the free block 24 within the destination chip.

Other configurations, operations, and effects are similar to those of the embodiment described above and thus, detailed description thereof is omitted here.

Third Embodiment

Next, a memory system, a control method thereof, and a program according to a third embodiment will be described in detail with reference to the drawings.

In the embodiments described above, a case in which whether or not ECC processing is to be executed during garbage collection is determined based on the wear information such as the error rate and the stress history is given as an example, but in the third embodiment, a case in which the determination is made based on the retention time (see FIG. 3) and a temperature history in addition to the error rate and the stress history will be described by way of an example. In this case, the retention time and the temperature history are also included in wear information.

Figure 14:
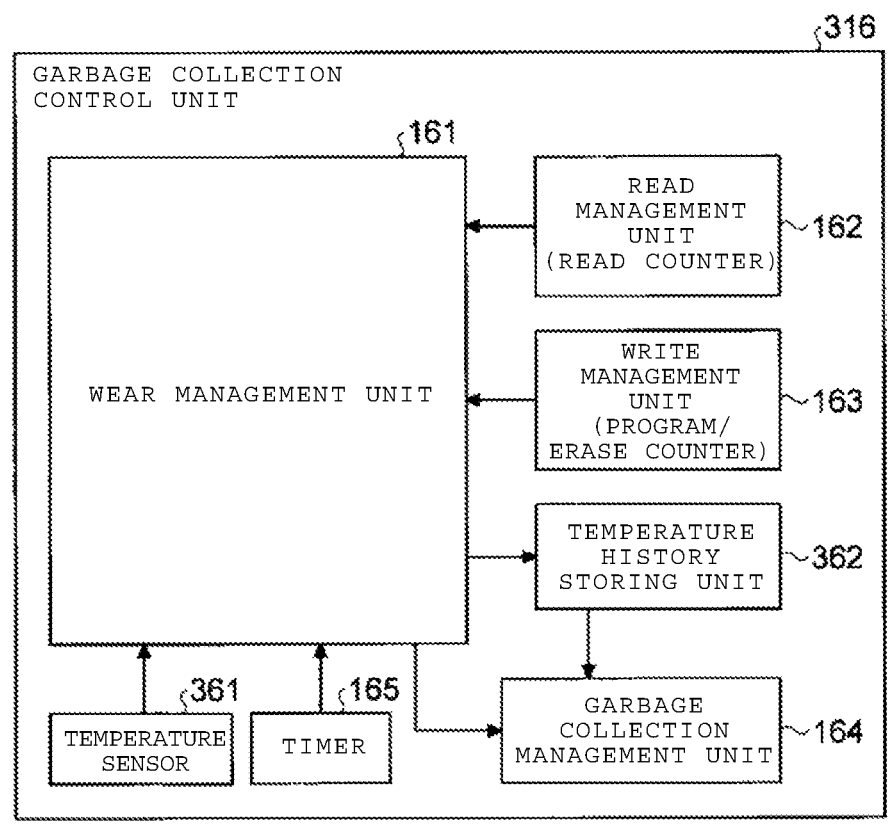
FIG. 14 is a schematic block diagram of a garbage collection control unit according to a third embodiment.

FIG. 14 is a schematic block diagram of a garbage collection control unit according to a third embodiment. A memory system according to the third embodiment may be the same as, for example, the memory system 1 illustrated in FIG. 1 or the memory system 200 illustrated in FIG. 12 and thus, redundant description will be omitted.

As illustrated in FIG. 14, a garbage collection control unit 316 includes, for example, a temperature sensor 361 and a temperature history storing unit 362, in addition to the same elements as the garbage collection control unit 16 illustrated in FIG. 2.

The temperature sensor 361 acquires temperature information around the memory chip 20, for example, periodically or according to a request from the wear management unit 161 or the like, and inputs the acquired temperature information to the wear management unit 161. A mounting position of the temperature sensor 361 is not limited to the inside of the garbage collection control unit 316, and can be changed to various positions at which a temperature of a necessary point can be measured.

When the temperature information is input from the temperature sensor 361, the wear management unit 161 stores the input temperature information in the temperature history storing unit 362 in correlation with the current date and time acquired from the timer 165. Accordingly, the temperature information is managed as a time series in the temperature history storing unit 362.

The garbage collection management unit 164, for example in step S104 in FIG. 4, acquires various information (for example, error rate, stress information, or the like in wear information) related to the collection source block and acquires the temperature information of a period of the data retention of the collection source block from the temperature history storing unit 362. In the operation illustrated in step S105 in FIG. 4 and specifically in FIG. 5, the garbage collection management unit 164 determines whether or not to execute the ECC processing based on the temperature information of a period of the data retention.

Figure 15:
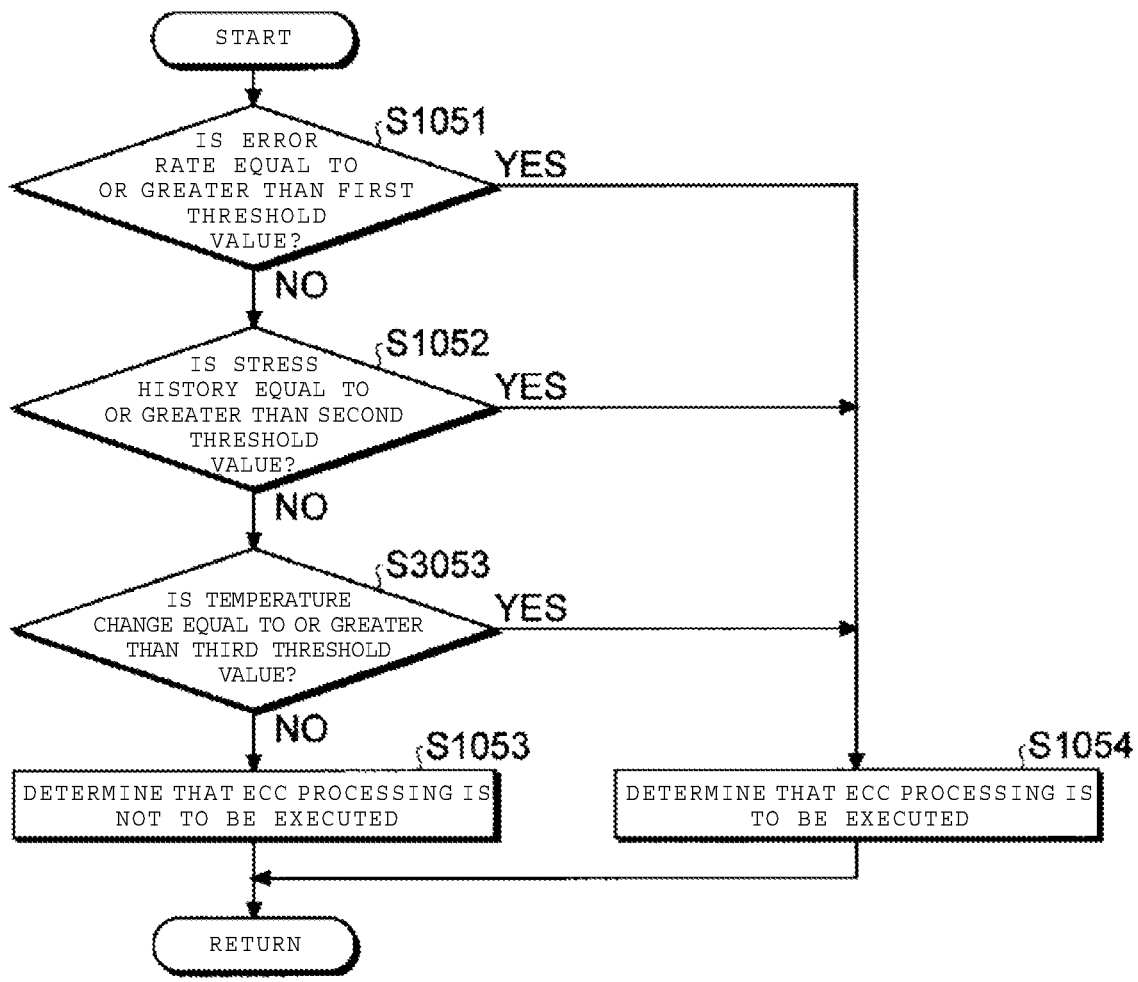
FIG. 15 is a flowchart illustrating an example of an operation to determine whether or not to execute ECC processing according to the third embodiment.

FIG. 15 is a flowchart illustrating an example of an operation to determine whether or not to execute the ECC processing according to the third embodiment. Other operations may be the same as, for example, the operations described with reference to FIGS. 4 to 6 in the first embodiment and thus, detailed description thereof will be omitted here.

As illustrated in FIG. 15, as a result of executing the same operations as steps S1051 to S1052 of FIG. 5, in a case where the error rate is less than the first threshold (NO in step S1051) and the stress history is less than the second threshold value (NO in step S1052), the garbage collection management unit 164 determines, for a targeted collection source block, whether a temperature change during the data retention is equal to or greater than a predetermined third threshold value or not (Step S3053). In a case where it is determined that the temperature change is equal to or greater than the third threshold value (YES in step S3053), the garbage collection management unit 164 determines that the ECC processing is to be executed (step S1054) and returns to the operation illustrated in FIG. 4. On the other hand, in a case where it is determined that the temperature change is less than the third threshold value (NO in step S3053), the garbage collection management unit 164 determines that the ECC processing is not to be executed (step S1053) and returns to the operation illustrated in FIG. 4.

A criteria to determine whether or not to execute the ECC processing based on the temperature history is not limited to the degree of the temperature change during the data retention. The criteria can be changed to include, for example, whether a temperature of the collection source block becomes equal to or greater than a predetermined temperature or equal to or less than the predetermined temperature during the data retention or not. The criteria can also be changed to include whether the time during which the temperature of the collection source block becomes equal to or greater than a predetermined temperature or equal to or less than the predetermined temperature exceeds a fixed time. The criteria can also be changed to include whether the number of times in which the temperature of the collection source block becomes equal to or greater than a predetermined temperature or equal to or less than the predetermined temperature exceeds a fixed number. In this case, the garbage collection management unit 164 may be configured to determine that the ECC processing is to be executed (step S1054 in FIG. 5) when the temperature of the collection source block during the data retention satisfies the criteria, and determine that the ECC processing is not to be executed (step S1053 in FIG. 5) when the temperature of the collection source block during the data retention does not satisfy the criteria.

As described above, it is possible to more accurately determine necessity of the ECC processing by configuring the garbage collection management unit 164 so as to determine whether to execute the ECC processing based on the wear information such as the error rate, the stress history, the temperature information, or the like. As a result, it is possible to implement a memory system capable of reducing power consumption during garbage collection without lowering reliability of the memory system.

Other configurations, operations, and effects are similar to those of the embodiments described above and thus, detailed description thereof is omitted here.

Fourth Embodiment

Next, a memory system, a control method thereof, and a program according to a fourth embodiment will be described in detail with reference to the drawings. In the fourth embodiment, an example case to avoid executing garbage collection without ECC processing consecutively for a predetermined number of times (for example, twice) or more for the same valid cluster will be described. For the sake of simplicity, in the fourth embodiment, a case to avoid executing garbage collection without ECC processing consecutively twice or more for the same valid cluster is described.

Figure 16:
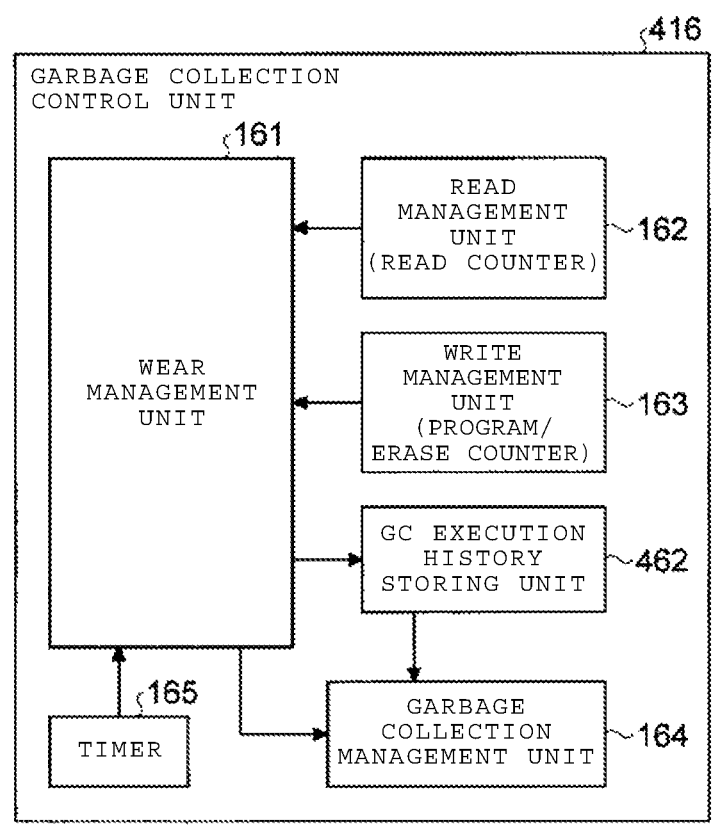
FIG. 16 is a schematic block diagram of a garbage collection control unit according to a fourth embodiment.

FIG. 16 is a block diagram of a garbage collection control unit according to the fourth embodiment. A memory system according to the fourth embodiment may be, for example, the same as the memory system 1 illustrated in FIG. 1 or the memory system 200 illustrated in FIG. 12 and thus, redundant description thereof will be omitted.

As illustrated in FIG. 16, a garbage collection control unit 416 further includes, for example, a garbage collection (GC) execution history storing unit 462 in addition to the same elements as the garbage collection control unit 16 illustrated in FIG. 2.

The GC execution history storing unit 462 manages whether ECC processing was executed for the valid cluster that is targeted for garbage collection in the past or not. The GC execution history storing unit 462 stores, as an garbage collection execution history, information as to whether, regarding each block, immediately preceding writing to the block was executed because of the block having become a free block of the movement destination of the valid cluster (hereinafter referred to as a movement destination block) in garbage collection or not and information as to whether ECC processing was executed or not in the case where the writing was executed because of the block having become the movement destination block in garbage collection. For the pieces of information, for example, a binary flag holding information with '0' and '1' can be used. However, it is not limited to the binary flag and various information forms can be used.

The garbage collection management unit 164 acquires various pieces of information related to the collection source block, for example, in step S104 of FIG. 4 and acquires the garbage collection execution history for the collection source block from the GC execution history storing unit 462. Then, the garbage collection management unit 164 determines whether or not to execute the ECC processing, based on the garbage collection execution history for the collection source block in the operation illustrated in step S105 (specifically, FIG. 5) of FIG. 4.

Figure 17:
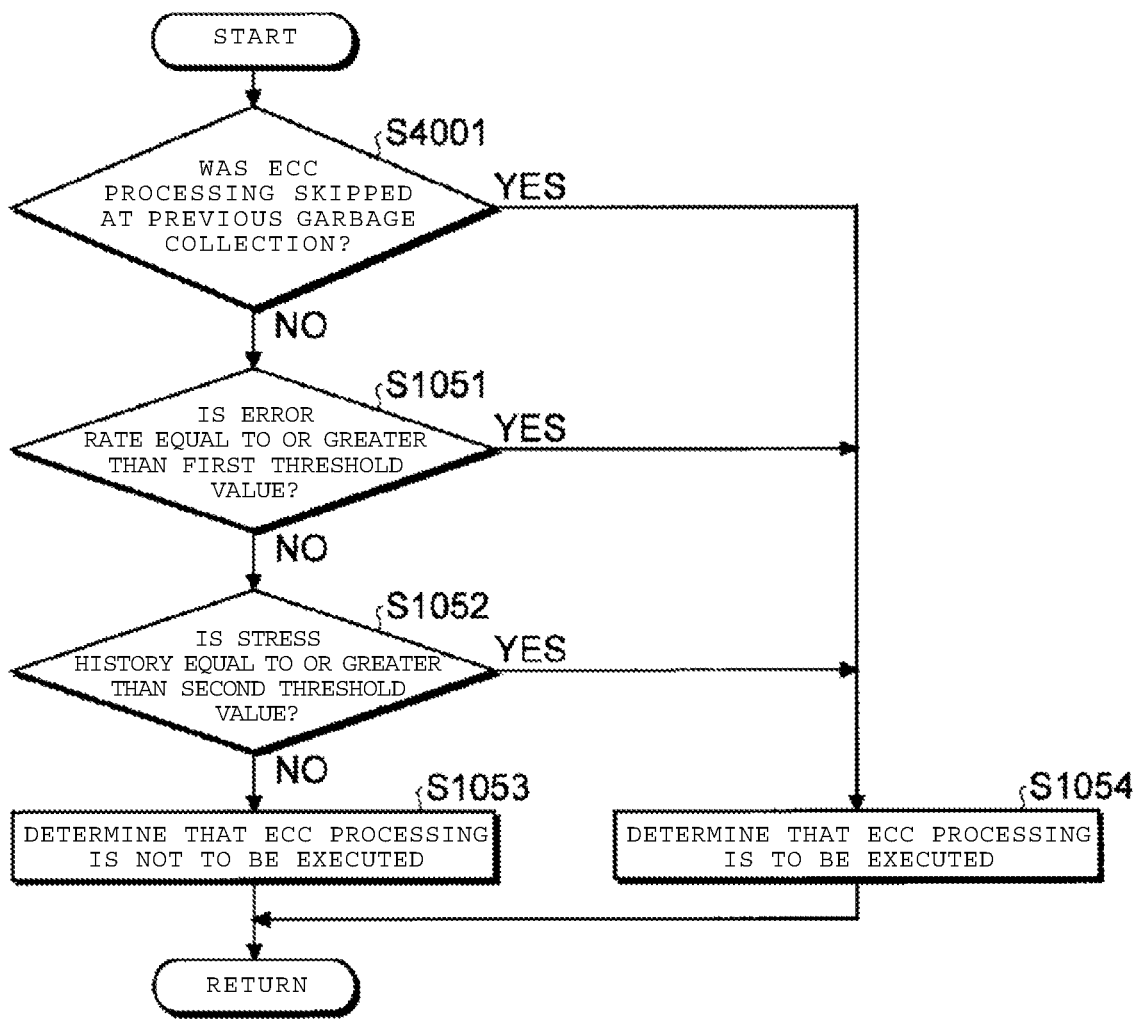
FIG. 17 is a flowchart illustrating an example of an operation to determine whether or not to execute ECC processing according to the fourth embodiment.

FIG. 17 is a flowchart illustrating an example of an operation to determine whether or not to execute the ECC processing according to the fourth embodiment. Other operations may be the same as the operations described with reference to FIGS. 4 to 6, for example, in the first embodiment and thus, detailed description thereof will be omitted here.

As illustrated in FIG. 17, based on a past garbage collection execution history acquired from the GC execution history storing unit 462, the garbage collection management unit 164 first determines, for the collection source block, whether the ECC processing was skipped at the time of previous garbage collection or not (step S4001). In a case where it is determined that the ECC processing was skipped at the time of the previous garbage collection (YES in step S4001), the garbage collection management unit 164 determines that the ECC processing is to be executed (Step S1054) for the valid cluster read from the collection source block, and returns to the operation illustrated in FIG. 4. On the other hand, in a case where it is determined that the ECC processing was executed at the time of the previous garbage collection (NO in step S4001), the garbage collection management unit 164 executes the same operations as the steps S1051 to S1054 of FIG. 5 to thereby determine whether the ECC processing is to be skipped or not, and thereafter, returns to the operation illustrated in FIG. 4.

In a case where it is permitted to consecutively execute garbage collection without ECC processing up to a predetermined number of times, which is twice or more, for the valid cluster of a movement target, the GC execution history storing unit 462 may store, for example, information as to whether the ECC processing was executed, for example, in units of valid clusters, during garbage collection for the predetermined number of times in the past as an garbage collection execution history. In this case, in step S4001 of FIG. 17, the garbage collection management unit 164 acquires the garbage collection execution history regarding the valid cluster that was set as the movement target during garbage collection from the GC execution history storing unit 462 and determines, based on the acquired garbage collection execution history, whether garbage collection without the ECC processing has been consecutively executed for the valid cluster the predetermined number of times immediately before. In a case where it is determined that garbage collection without ECC processing has been consecutively executed the predetermined number of times immediately before (YES in step S4001), the garbage collection management unit 164 determines, for the valid cluster, that ECC processing is to be executed (step S1054) and returns to the operation illustrated in FIG. 4. On the other hand, in a case where it is determined that garbage collection without ECC processing has not been executed consecutively the predetermined number of times immediately before (NO in step S4001), the garbage collection management unit 164 performs the same operations as steps S1051 to S1054 in FIG. 5 so as to determine whether the ECC processing is to be skipped or not, and thereafter returns to the operation illustrated in FIG. 4

Also, in a case where garbage collection is executed in units of blocks, and executing garbage collection without ECC processing consecutively up to a predetermined number of times (which is twice or more for valid clusters included in the block of the movement target) is permitted, similarly, the GC execution history storing unit 462 is required to store information as to whether ECC processing was executed during the garbage collection, for example, in units of valid clusters, as the garbage collection execution history. In this case, in step S4001 of FIG. 17, the garbage collection management unit 164 acquires the garbage collection execution history regarding all valid clusters included in the block that was set as the movement target during garbage collection from the garbage collection execution history storing unit 462. The garbage collection management unit 164 then determines whether the largest value of the number of consecutive execution times of garbage collection without ECC processing among the acquired garbage collection execution history is equal to or greater than the predetermined number or not. In a case where it is determined that the largest value of the number of consecutive execution times is equal to or greater than the predetermined number (YES in step S4001), the garbage collection management unit 164 determines, for the valid cluster included in the block, that ECC processing is to be executed (step S1054) and returns to the operation illustrated in FIG. 4. On the other hand, in a case where it is determined that the largest value of the number of consecutive execution times is less than the predetermined number (NO in step S4001), the garbage collection management unit 164 executes the same operations as steps S1051 to S1054 in FIG. 5 so as to determine whether the ECC processing is to be skipped or not and thereafter, returns to the operation illustrated in FIG. 4.

As described above, a configuration in which, in addition to wear information such as the error rate and the stress history, whether or not to execute ECC processing is determined based on whether the ECC processing was executed in the past garbage collection for the valid cluster which is the movement target, is adopted and accordingly, it is possible to avoid matters that garbage collection without ECC processing is consecutively executed a predetermined number of times or more for the same valid cluster. As a result, it is possible to implement a memory system capable of reducing power consumption during garbage collection without lowering reliability of the memory system.

Other configurations, operations, and effects are similar to those of the embodiments described above and thus, detailed description thereof will be omitted here.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
a nonvolatile memory that has a plurality of physical blocks; and
a memory controller circuit configured to execute encoding of data to be written in the nonvolatile memory and decoding of data read from the nonvolatile memory, and execute garbage collection for the nonvolatile memory, wherein
the memory controller circuit is configured to determine whether or not to execute the decoding for data which is read from a valid cluster of a physical block targeted for garbage collection,
the memory controller circuit is configured to determine that the decoding is not to be executed for data read from a valid cluster of a first physical block targeted for the garbage collection and to be executed for data read from a valid cluster of a second physical block targeted for the garbage collection, the second physical block having a higher level of wear than the first physical block, and
the memory controller circuit is further configured to determine whether to execute the decoding for the data within the valid cluster targeted for the garbage collection, based on temperature information indicative of temperature around the nonvolatile memory.

2. The memory system according to claim 1,
wherein the memory controller circuit is configured to determine whether or not to execute the decoding based on an error rate of data read from each physical block.

3. The memory system according to claim 2,
wherein the error rate of each physical block is calculated based on the number of error bits included in data read at the time of data read for each physical block.

4. The memory system according to claim 2,
wherein the error rate is estimated by using the number of reads for each physical block.

5. The memory system according to claim 1,
wherein the memory controller circuit is further configured to determine that the decoding for the data within the valid cluster targeted for the garbage collection is to be executed if the number of consecutive times the decoding was not executed for the data within the valid cluster targeted for the garbage collection exceeds a threshold number.

6. The memory system according to claim 1,
wherein the memory controller circuit further includes a randomizer that randomizes data to be written in the nonvolatile memory using a pseudo random number generated according to a storage location of the data in the nonvolatile memory, and
the memory controller circuit is further configured to turn off a decoder circuit so that is passed through the randomizer so as to be subjected to de-randomization.

7. A memory system, comprising:
a nonvolatile memory that has a plurality of physical blocks; and
a memory controller circuit configured to execute encoding of data to be written in the nonvolatile memory, decoding of data read from the nonvolatile memory, and garbage collection for the nonvolatile memory, wherein
the memory controller circuit is configured to determine whether or not to execute the decoding for data which is read from a valid cluster of a physical block targeted for garbage collection based on the number of times of program/erase of the physical block, and
the memory controller circuit is further configured to determine that the decoding for the data within the valid cluster targeted for the garbage collection is to be executed if the number of consecutive times the decoding was not executed for the data within the valid cluster targeted for the garbage collection exceeds a threshold number.

8. The memory system according to claim 7,
wherein the memory controller circuit is configured to determine whether or not to execute the decoding based on an error rate of data read from each physical block.

9. The memory system according to claim 7,
wherein the memory controller circuit is further configured to determine whether or not to execute the decoding for the data within the valid cluster targeted for the garbage collection based on temperature information indicative of temperature around the nonvolatile memory.

10. The memory system according to claim 7,
wherein the memory controller circuit further includes a randomizer that randomizes data to be written in the nonvolatile memory using a pseudo random number generated according to a storage location of the data in the nonvolatile memory, and
the memory controller circuit is further configured to turn off a decoder circuit so that is passed through the randomizer so as to be subjected to de-randomization.

11. A memory system, comprising:
a nonvolatile memory that has a plurality of physical blocks; and
a memory controller circuit configured to execute encoding of data to be written in the nonvolatile memory and decoding of data read from the nonvolatile memory, and execute garbage collection for the nonvolatile memory, wherein
the memory controller circuit is configured to determine whether to execute the decoding for data which is read from a valid cluster of a physical block targeted for garbage collection,
the nonvolatile memory includes memory chips connected to a first channel extending from the memory controller circuit and memory chips connected to a second channel extending from the memory controller circuit,
the memory controller circuit is further configured to preferentially select, as a write destination for data read from a valid cluster of a source physical block, another physical block within the same memory chip as the source physical block over another physical block in another memory chip connected to the same channel and over another physical block in another memory chip connected to a different channel,
the memory controller circuit is configured to preferentially select, as the write destination for data read from the valid cluster of the source physical block, another physical block in another memory chip connected to the same channel over another physical block in another memory chip connected to a different channel,
the memory system includes multiple interface chips for each of the first and second channels,
the memory controller circuit is further configured to preferentially select, as the write destination for data read from the valid cluster of the source physical block, another physical block which is in a first memory chip that is controlled by the same interface chip as is the memory chip of the source physical block over another physical block which is in a second memory chip that is controlled by a different interface chip from the interface chip that controls the memory chip of the source physical block, and
the memory controller circuit is further configured to not execute error correction processing for the data read from the valid cluster of the source physical block when the write destination is selected as another physical block of a memory chip that is connected to a different channel than the memory chip of the source physical block.

12. The memory system according to claim 11,
wherein the memory controller circuit is configured to determine whether or not to execute the decoding based on an error rate of data read from each physical block.

13. The memory system according to claim 11,
wherein the memory controller circuit is further configured to determine that the decoding for the data within the valid cluster targeted for the garbage collection is to be executed if the number of consecutive times the decoding was not executed for the data within the valid cluster targeted for the garbage collection exceeds a threshold number.

14. The memory system according to claim 11,
wherein the memory controller circuit is further configured to determine whether or not to execute the decoding for the data within the valid cluster targeted for the garbage collection based on temperature information indicative of temperature around the nonvolatile memory.

15. The memory system according to claim 11,
wherein the memory controller circuit further includes a randomizer that randomizes data to be written in the nonvolatile memory using a pseudo random number generated according to a storage location of the data in the nonvolatile memory, and
the memory controller circuit is further configured to turn off a decoder circuit so that is passed through the randomizer so as to be subjected to de-randomization.

* * * * *